United States Patent [19]
Frechette et al.

[11] Patent Number: 5,904,503
[45] Date of Patent: May 18, 1999

[54] METHOD OF FORMING FLAT INNER LEAD TIPS ON LEAD FRAME

[75] Inventors: Raymond A. Frechette, North Providence, R.I.; Christopher M. Sullivan, Rochester, Mass.

[73] Assignee: Texas Instruments Incorporated, Dallas, Tex.

[21] Appl. No.: 08/992,149

[22] Filed: Dec. 17, 1997

Related U.S. Application Data

[60] Provisional application No. 60/033,528, Dec. 20, 1996.
[51] Int. Cl.⁶ ....................................................... H01L 21/48
[52] U.S. Cl. .............................................. 438/123; 29/827
[58] Field of Search ................................. 29/827; 438/123

[56] References Cited

U.S. PATENT DOCUMENTS 5,683,943  11/1997  Yamada ..................................... 437/220

*Primary Examiner*—Olik Chaudhuri
*Assistant Examiner*—Douglas A. Wille
*Attorney, Agent, or Firm*—W. James Brady III; Richard L. Donaldson

[57] ABSTRACT

The invention is a method which deliberately applies exaggerated features (22,32) on the photo-image used to pattern the lead frame for etching. The resulting etched leads (20,25,29) will have a flat to concave shape at the end of the lead tips (23,26,30), which can be used to "self-center" wire bond paths, eliminating the slung wire tendency altogether, provided the wire path crosses the lead tip within the concave shape region.

16 Claims, 5 Drawing Sheets

METHOD OF FORMING FLAT INNER LEAD TIPS ON LEAD FRAME

This application claims priority under 35 USC § 119(e)(1) of provisional application No. 60/033,528 filed Dec. 20, 1996.

FIELD OF THE INVENTION

This invention relates to semiconductor devices, and more particularly to an etched lead frame lead and a method of producing lead frame lead tips to reduce slung wires and wire sweep in integrated circuit assembly.

BACKGROUND OF THE INVENTION

Wire bonding processes, especially on Lead-Over-Chip (LOC) devices, are sensitive to the shape of the lead tip, leading to a significant frequency of "slung wires" which in turn can lead to yield loss and impaired reliability of the assembled IC's. In the case of LOC devices, the stitch bond to the lead tip is substantially above the plane of the chip/ball bond, resulting in a loop shape as the bond capillary approaches the second or stitch bond to the lead finger. When this loop touches the end of the lead, there is a strong tendency for the wire to be deflected laterally just prior to capillary touchdown, resulting in a slung wire. "Slung wire" is a term used to describe an IC assembly fault resulting from a lateral deflection of the interconnection wire from its intended path. Reduced clearance between adjacent wires are potential performance and reliability problems. If the lead tip is rounded, as is generally the case with chemically etched lead frames, the slung wire probability is greatly increased. Conventional methods of designing photomasks to produce etched lead frames cannot eliminate this rounding tendency, especially as lead pitch or center to center distances become smaller to accommodate higher density devices.

Production of lead frames by stamping, as opposed to chemical etching, results in lead tips that are cut square, reducing the tendency to have deflected or slung wires at assembly. This, however is cost justified only on stable high volume designs with adequate product life. Many new and high density products are not well suited to immediate conversion to stamping, so an etch solution is desirable.

Other conventional solutions involve very special and sometimes complex wire loop paths, which can imply more gold wire consumption and reduced productivity.

SUMMARY OF THE INVENTION

The invention is a new method to etch relatively fine pitch inner lead patterns on lead frames, which can provide a lead tip shape which is flat or concave shape at the ends of the internal leads.

The method involves deliberately applying exaggerated features on the photo-image used to pattern the lead frame for etching. The resulting etched lead will have a flat to concave shape at the end of the lead tip, which can be used to "self-center" wire bond paths, eliminating the slung wire tendency altogether, provided the wire path crosses the lead tip within the concave shape region.

The exaggerated features may be in the form of an extra-long bias or longitudinal extension on each or every other lead finger on the photo-image used to pattern the lead frame for etching. A "mushroom" shape inhibits the rapid etching and rounding of the exposed lead tips, and, at the same time, shields the shorter interspersed leads from the full corrosion effects of the etchant. The result is lead tips with a flat or relatively square end shape. The flat end shape reduces the slung wire tendency at wire bond. This approach may include a deliberate extension of every other finger in length in the finished lead frame, which can be accommodated in packaging and assembly process designs.

These solutions provide a favorable shape to the lead finger, which favorably influences the wire bond assembly process capability. This is not only using prevention, but using the understanding of the mechanics of wire deflection to self-center the wire position, making it even better in resisting mold sweep displacement. Such solutions to provide a concave shaped lead tip can also be used in the stamping process to provide self-centering wire tendencies.

DESCRIPTION OF PREFERRED EMBODIMENTS

Figure 1:
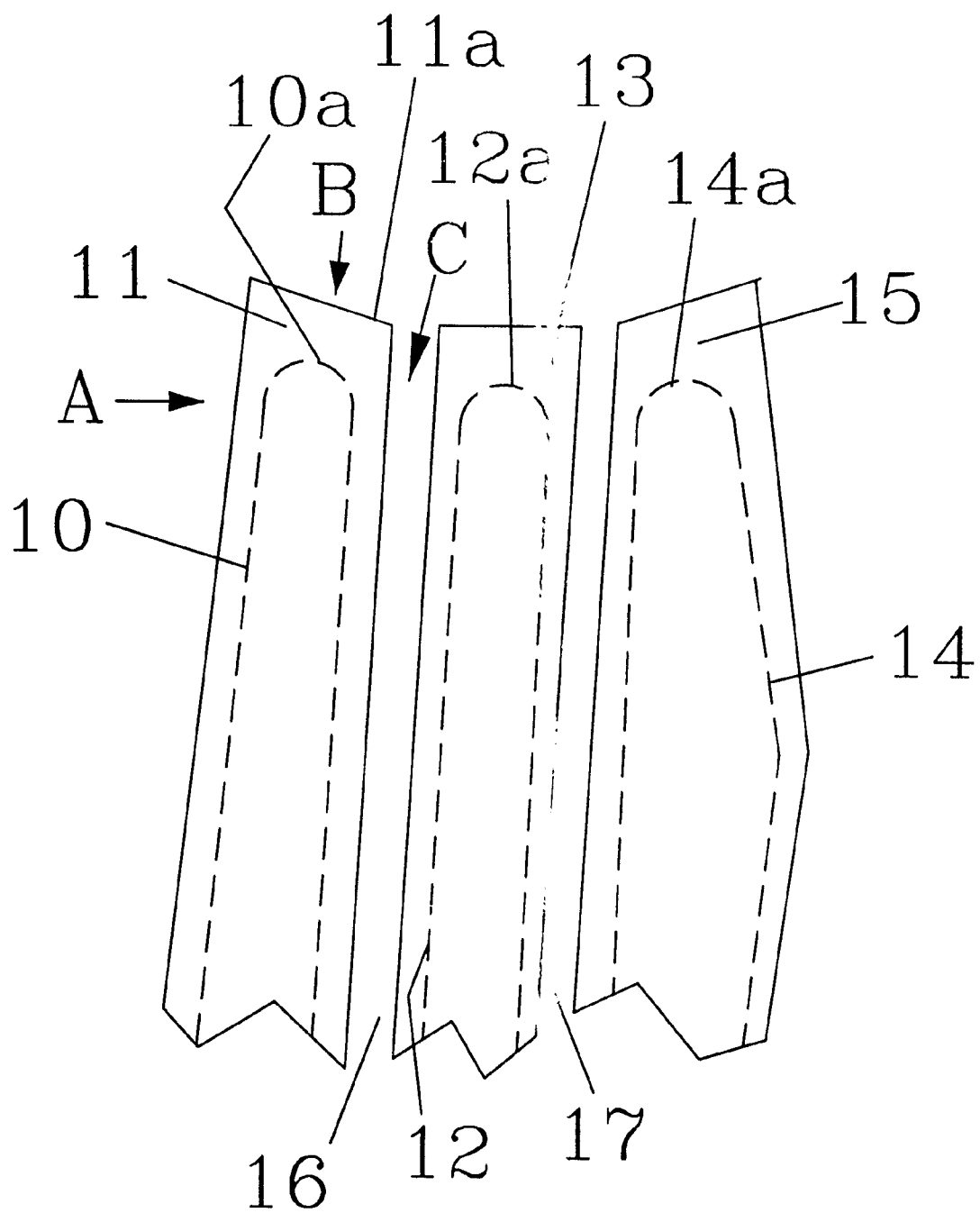
FIG. 1 is a partial view of lead frame leads masked for etching according to the prior art.

FIG. 1 is a partial view of a semiconductor lead frame showing three leads 10, 12 and 14 (in dashed lines) which have been formed from chemical etching utilizing masking according to the prior art. The three leads 10, 12 and 14, which are etched from a metal sheet or strip form, have been masked with masks 11, 13 and 15. A chemical etchant such as cupric chloride or ferric chloride, or other suitable chemical, is applied around and over the masked metal from which the leads are formed. The etchant etches the masked metal from sides A, B and C, as shown for lead 10, etching away the metal leaving lead 10. Similarly, lead 12 is masked with mask 13 and lead 14 is masked with mask 15. The etchant dissolves the metal from the edges of the masks, forming the leads.

The resulting leads 10, 12 and 14, have respective rounded lead tips 10a, 12a and 14a. The rounding of the leads results from etching on three sides. The rounded tips often cause a "slung" lead wire when the wire is deflected laterally just prior to capillary touchdown, resulting in a dislocated wire path.

Figure 2:
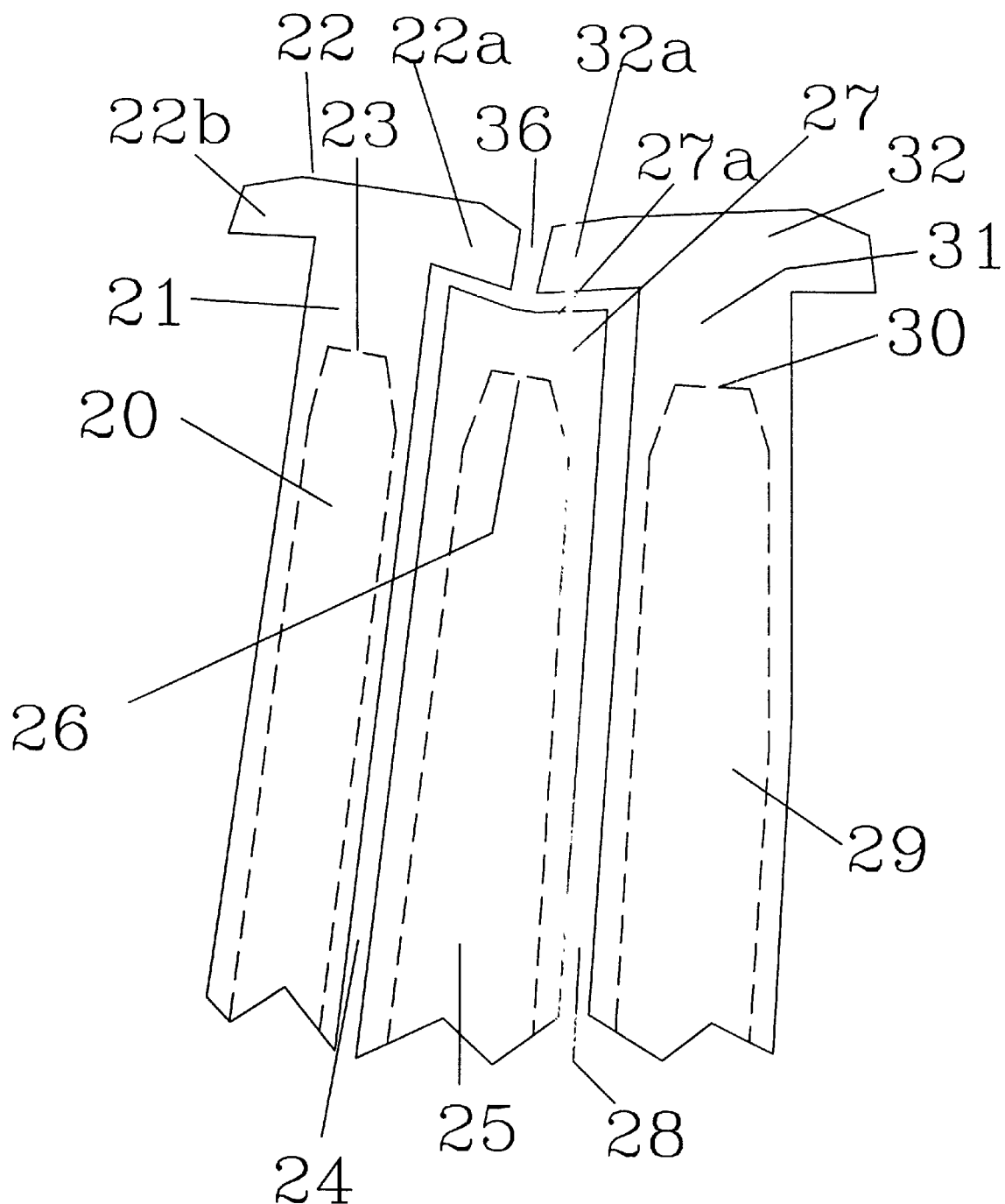
FIG. 2 is a partial view of lead frame leads masked for etch compensation according to the present invention.

FIG. 2 is useful in understanding a first embodiment in a method for etching lead frame lead fingers. Masks, for producing leads, are placed over the metallic sheet or strip, from which the lead fingers are to be produced. The masks are patterned to have exaggerated features on alternate masks. The exaggerated features are applied to the ends of the mask which are over the lead frame material from which the inner ends of the lead frame leads are formed, that is, the ends of the leads that are connected to the semiconductor chip, for example, by bond wires, and are internal to the package of the device.

Figure 2A:
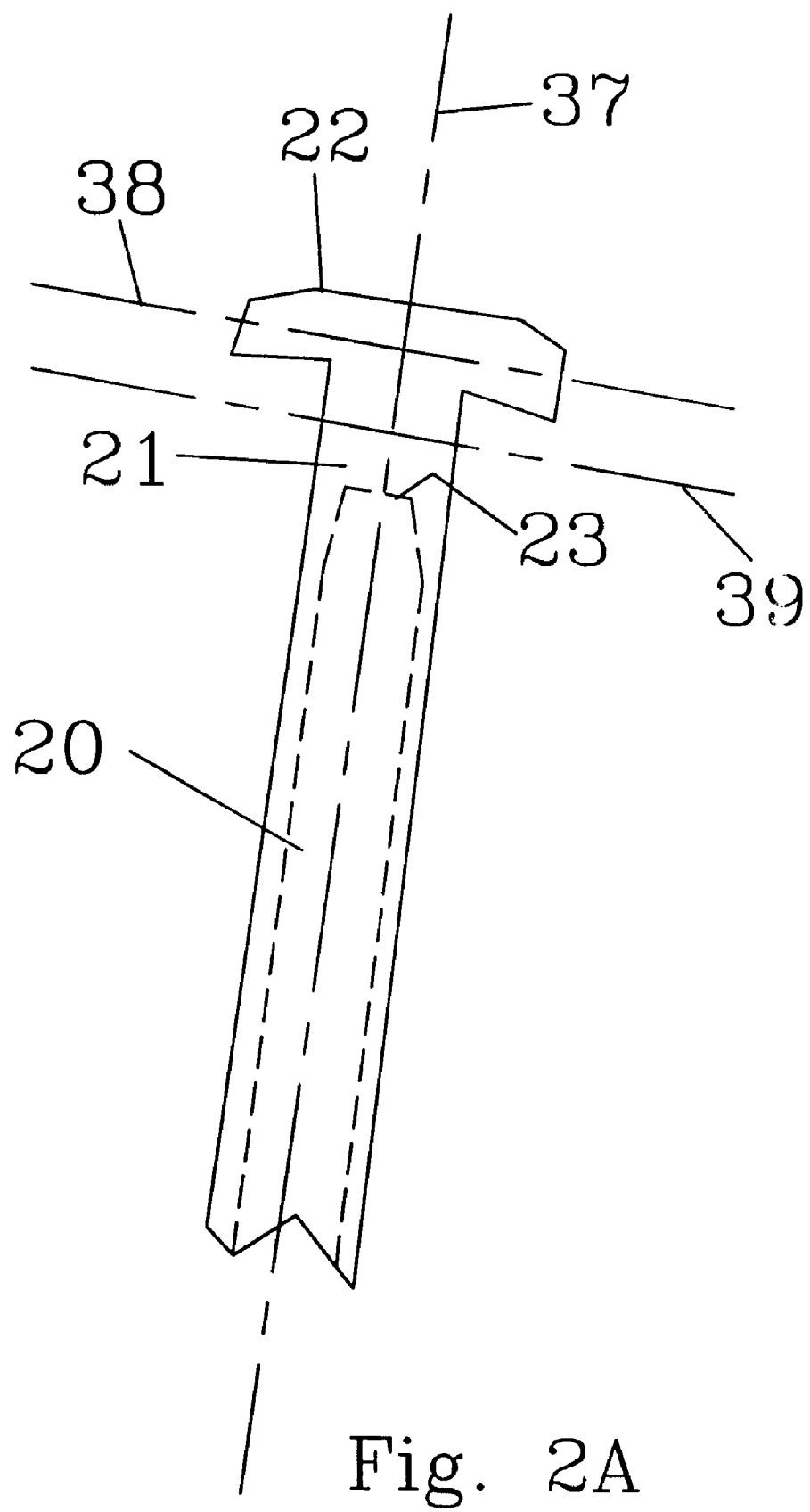
FIG. 2A shows a single lead mask with longitudinal and lateral extensions.

The exaggerated features, as illustrated in FIG. 2, are longitudinal and lateral extensions to the mask. Examples of extensions are shown in FIG. 2A. Line 37 is an approximate longitudinal axis for lead 20, and line 38 shows the axis for lateral extension 22. The longitudinal extension of the mask is understood when comparing the location, for example, of the end 22 of the mask 21 in FIG. 2 with the end 11a of mask 11 in FIG. 1. The end 22 of mask 21 is further from the end of resulting lead 20, than the end 11a of mask 11 from the end of the resulting lead 10. Line 39 shows an approximate end of the mask 11 shown in FIG. 1. For example, in FIG. 2, mask 21 has an end 22 with lateral extensions 22a and 22b that extend laterally to longitudinal axis 37 (FIG. 2A). Lateral extension 22a extends beyond and adjacent to end 27a of mask 27. Similarly, mask 31 has a lateral extension 32a that extends beyond and adjacent to the end 27a of mask 27. This overlap of the ends of alternate masks, with a channel between the overlaps, is what causes the ends of the leads to be etched in the desired pattern.

The ends of the leads 23,26 and 30 are slightly tapered from the sides of the leads to the flat or concave ends 23, 26 and 30. The tapering is caused by the apparent faster etching from the sides of masks 21, 27 and 31, and the slower etching from the ends of the masks. The etching is not really faster or slower, it is the distance from the edge of the mask to the resultant lead that causes the apparent different in etching speeds. For example, there is a smaller distance from the side of mask 31 to the resultant edge of lead 29 than from the resultant end 30 from the end of mask portion 32. It is the shape of the mask that determines the shape of the resultant lead, and the exaggerated or longitudinal and lateral extensions of the lead pattern produces the desired flat or slightly concave lead end.

Only three leads, and masks, are shown in FIG. 2, but the masking is substantially the same for all leads on the lead frame. The lateral extensions on alternate lead masks, extensions 22a and 32a, do not meet, but provide a channel 36 between lateral extension 22a and 32a so etchant can etch the lead frame lead material in forming the leads.

FIG. 2 shows, in dashed lines, the resulting leads 20, 25, and 29 etched utilizing the masks 21, 27 and 31, respectively. The exaggerated features defined above slow the etching process when compared with the etching of the sides of lead 20. Etching of the left side of lead 25 and the right side of lead 20 in the space 24 between masks 21 and 27 is faster, since there is a lesser distance from the mask to the resultant lead than from the end 22 of mask 21 to the resultant end of lead 20. There is an equivalent result when etching leads 25 and 29.

The features 22 and 32, which have the lateral extension 22a and 32a, respectively, provide the etch compensation for all three leads 20, 25 and 29. The openings between the masks, for example openings 24 and 28, are the same for all openings between leads providing the same etch compensation between all the leads in a lead frame. This results in the flat end 23 of lead 20, and the other lead ends 26 and 30, which are less likely to deflect bond wires during bonding.

Figure 3:
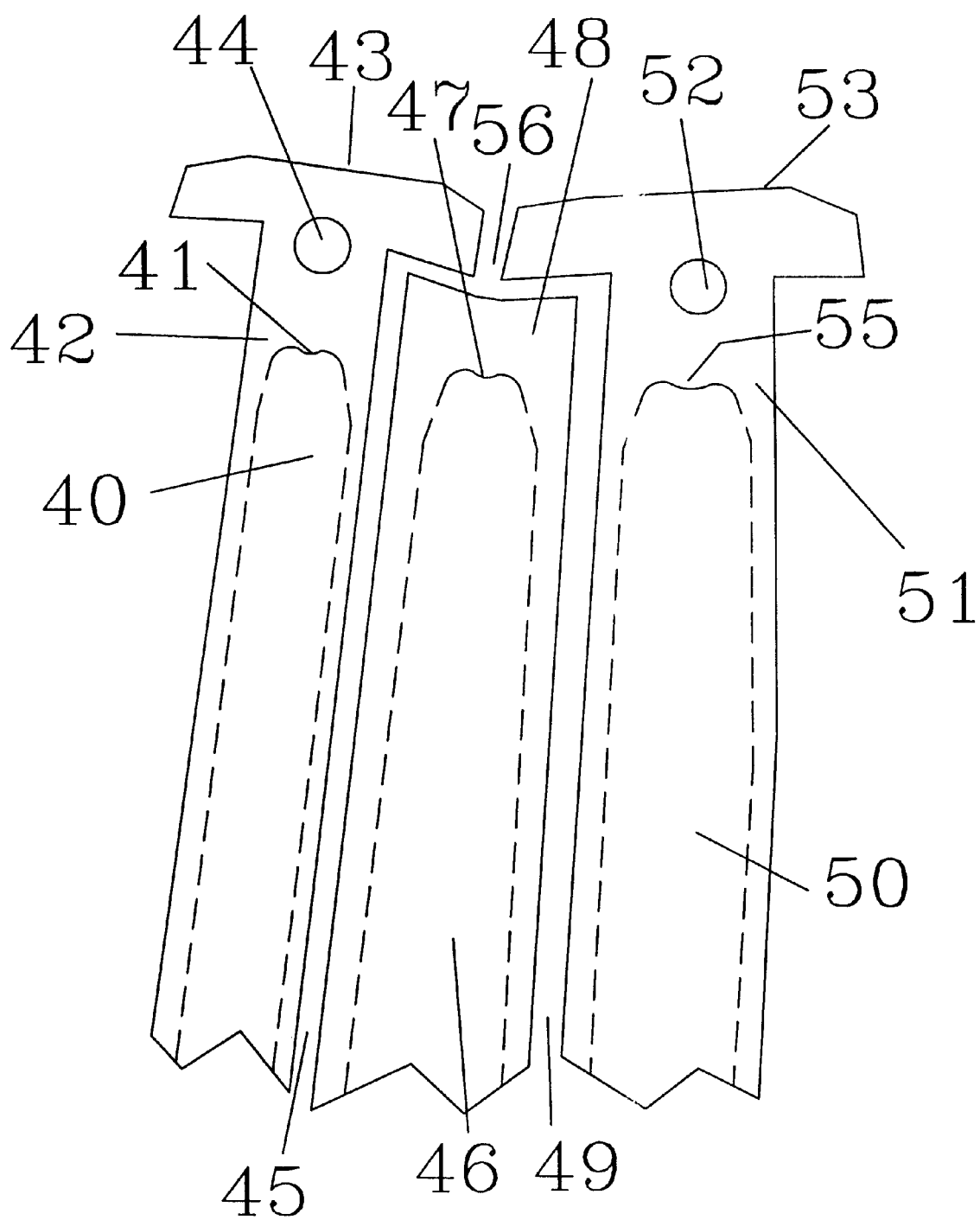
FIG. 3 is a partial view of lead frame leads similar to FIG. 2 with a variation in etching compensation.

FIG. 3 shows a modification to the mask of FIG. 2, wherein each of the masks 42 and 51 have openings 44 and 52, respectively, which openings are areas that are not covered with etch resistant mask material. The openings are in an area below the ends 43 and 53 of masks 42 and 51, respectively, but in the longitudinal extensions of masks 42 and 51. The metallic lead material covered by masks 42, 48 and 51 will etch to produce the shown leads 40, 46 and 50, respectively. Each of the leads 40, 46 and 50 will have concave ends 41, 47 and 55, respectively, which result from etching through openings 44 and 52, and the space 56 between mask ends 43 and 53. These concave ends help center bond wires during bonding.

Figure 4:
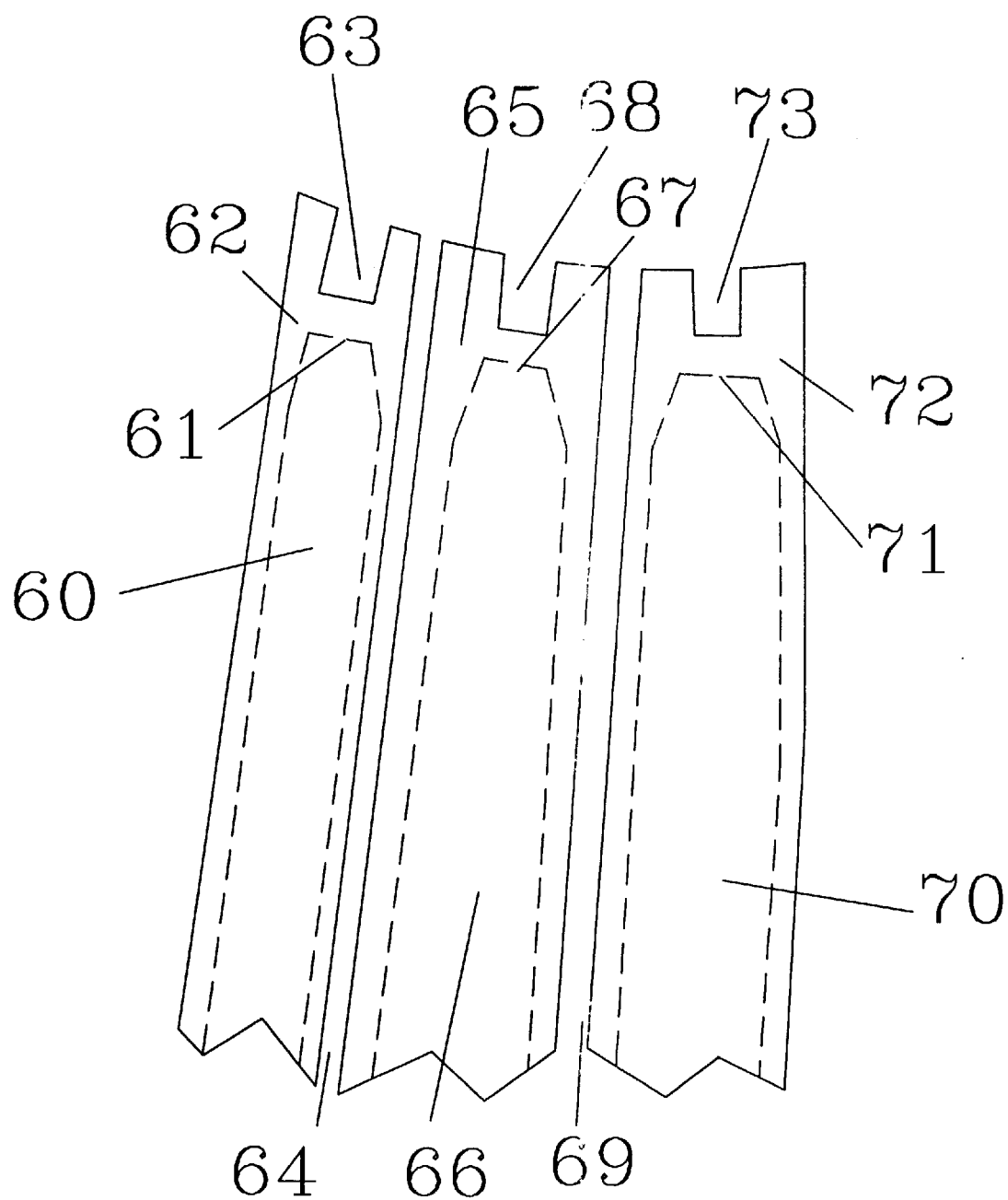
FIG. 4 is another embodiment of etch compensation for etching according to the present invention.

FIG. 4 shows a variation of the features on the etching masks. Each of masks 62, 65 and 72 extend longitudinal further from the ends of resulting leads than the mask ends shown in FIG. 1. The masks 62, 65 and 72 have openings 63, 68 and 73, respectively, that produce, during etching, a flat or slightly concave end 61,67 and 71 on each of the leads 60, 66 and 70, respectively. Ends 61, 67 and 71 of leads 60, 66 and 70, respectively, result from the etch compensation provided by the castellated notched ends which include notches 63, 68 and 73 of masks 62, 65 and 72, respectively. The degree of flatness or slight concave ends of leads 60, 66 and 70 depends upon the distance from the resulting lead ends from the distance between resultant lead end and the bottom of the mask notch, and the distances 64 and 69 between masks, and can be varied by varying these distances.

What is claimed:

1. A method for forming patterned inner lead tips on lead frame leads, comprising the steps of:

applying an etch resistant material over a lead frame material to be patterned;

patterning the etch resistant material to provide exaggerated features over and adjacent to the inner lead tips of the lead frame leads; and etching the lead frame to form flat inner lead tips.

2. The method according to claim 1, wherein patterned etch resistant material is patterned to etch the lead frame to provide concave inner lead tips.

3. The method according to claim 1, wherein the exaggerated mask features are over every other lead to be formed, and the features extend over adjacent leads.

4. The method according to claim 1, wherein the exaggerated features have an opening in the etch resistant material adjacent to an area where a lead tip is to be formed.

5. The method according to claim 1, wherein the patterned etch resistant material extends beyond an area that inner lead tips are to be formed, and patterned etch resistant material has a notch therein to control etching of the inner lead tips.

6. A method for forming patterned inner lead tips on lead frame leads, comprising the steps of:

applying an etch resistant material over a lead frame material to be patterned;

patterning the etch resistant material to provide exaggerated features over and adjacent the inner lead tips of the lead frame leads;

patterning the exaggerated features over every other lead to be formed, and the features patterns extend over adjacent leads; and etching the lead frame to form flat inner lead tips.

7. The method according to claim 6, wherein patterned etch resistant material is patterned to etch the lead frame to provide concave inner lead tips.

8. The method according to claim 6, wherein the exaggerated features have an opening in the etch resistant material adjacent to an area where a lead tip is to be formed.

9. The method according to claim 6, wherein the patterned etch material extends beyond an area that inner lead tips are to be formed, and patterned etch material has a notch therein to control etching of the inner lead tips.

10. A method for forming patterned inner lead tips on lead frame leads, comprising the steps of:

applying an etch resistant material to provide lead masks over lead frame material to be etched;

patterning the etch resistant material to provide an extension to the lead masks, extending the length of the mask under which the inner leads tips are formed; and etching the masked lead frame material to form leads with flat inner lead tips which result from the extensions in the mask.

11. The method according to claim 10, wherein a notch is provided in each of the extensions of the lead masks.

12. The method according to claim 10, wherein axial and lateral extensions of the etch resistant material are formed on alternate lead masks.

13. The method according to claim 12, where an opening is provide in the mask extension on the alternate lead masks.

14. The method according to claim 12, wherein the lateral extensions on alternate lead mask extend beyond and adjacent to an adjacent end of an adjacent lead mask.

15. A method for forming patterned inner lead tips on lead frame leads, comprising the steps of:

applying an etch resistant material to provide individual lead masks over lead frame material to be etched;

patterning the etch resistant material to provide a longitudinal extension to at least alternate lead masks, said longitudinal extension including lateral extensions extending from two sides of the longitudinal extension, said extensions extending the length of the mask end under which the inner leads tips are formed; and etching the masked lead frame material to form leads with flat inner lead tips which result from the extensions to the mask.

16. The method according to claim 15, wherein the lateral extensions of a first alternate lead mask extend toward and adjacent to a lateral extension of a second alternate lead mask, forming a channel above the lead mask between the adjacent lateral extensions of the first and second alternate lead masks.

* * * * *